US008659054B2

(12) United States Patent
Rim et al.

(10) Patent No.: US 8,659,054 B2
(45) Date of Patent: Feb. 25, 2014

(54) METHOD AND STRUCTURE FOR PFET JUNCTION PROFILE WITH SIGE CHANNEL

(75) Inventors: Kern Rim, Yorktown Heights, NY (US); William K. Henson, Beacon, NY (US); Yue Liang, Beacon, NY (US); Xinlin Wang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 12/905,158

(22) Filed: Oct. 15, 2010

(65) Prior Publication Data

US 2012/0091506 A1    Apr. 19, 2012

(51) Int. Cl.
*H01L 29/66* (2006.01)
*H01L 21/8238* (2006.01)
*H01L 21/425* (2006.01)

(52) U.S. Cl.
USPC .................... 257/192; 438/217; 438/517

(58) Field of Classification Search
USPC .................... 257/183–201; 438/197–233
See application file for complete search history.

(56) References Cited

U.S. PATENT DOCUMENTS

| 5,731,626 | A  | * | 3/1998  | Eaglesham et al. ........... 257/607 |
| 6,153,920 | A  |   | 11/2000 | Gossmann et al. |
| 6,707,132 | B1 | * | 3/2004  | Banerjee et al. .............. 257/616 |
| 6,809,016 | B1 |   | 10/2004 | Xiang |
| 6,830,980 | B2 | * | 12/2004 | Mansoori et al. ............. 438/308 |
| 7,023,055 | B2 |   | 4/2006  | Ieong et al. |
| 7,098,095 | B1 | * | 8/2006  | Naem et al. ................... 438/199 |
| 7,118,973 | B1 | * | 10/2006 | Naem ........................... 438/285 |
| 7,329,923 | B2 |   | 2/2008  | Doris et al. |
| 7,601,996 | B2 | * | 10/2009 | Ohta et al. .................... 257/213 |
| 2002/0033511 | A1 | * | 3/2002 | Babcock et al. .............. 257/408 |
| 2002/0125502 | A1 | * | 9/2002 | Baba et al. .................... 257/200 |
| 2003/0052348 | A1 | * | 3/2003 | Takagi et al. ................. 257/288 |
| 2003/0146494 | A1 | * | 8/2003 | Puchner et al. ............... 257/616 |
| 2004/0007715 | A1 | * | 1/2004 | Webb et al. ................... 257/192 |
| 2005/0017265 | A1 |   | 1/2005 | Takagi et al. |
| 2005/0116290 | A1 |   | 6/2005 | de Souza et al. |
| 2006/0046507 | A1 | * | 3/2006 | Tweet ........................... 438/758 |
| 2008/0006880 | A1 | * | 1/2008 | Orlowski et al. ............. 257/369 |
| 2009/0065853 | A1 |   | 3/2009 | Hanafi |

OTHER PUBLICATIONS

International Search Report/Written Opiinion, Mar. 14, 2012.

* cited by examiner

*Primary Examiner* — Fernando L Toledo
*Assistant Examiner* — Karen Kusumakar
(74) *Attorney, Agent, or Firm* — Scully, Scott, Murphy & Presser, P.C.; H. Daniel Schnurmann

(57) ABSTRACT

A semiconductor structure including a p-channel field effect transistor (pFET) device located on a surface of a silicon germanium (SiGe) channel is provided in which the junction profile of the source region and the drain region is abrupt. The abrupt source/drain junctions for pFET devices are provided in this disclosure by forming an N- or C-doped Si layer directly beneath a SiGe channel layer which is located above a Si substrate. A structure is thus provided in which the N- or C-doped Si layer (sandwiched between the SiGe channel layer and the Si substrate) has approximately the same diffusion rate for a p-type dopant as the overlying SiGe channel layer. Since the N- or C-doped Si layer and the overlying SiGe channel layer have substantially the same diffusivity for a p-type dopant and because the N- or C-doped Si layer retards diffusion of the p-type dopant into the underlying Si substrate, abrupt source/drain junctions can be formed.

19 Claims, 3 Drawing Sheets

METHOD AND STRUCTURE FOR PFET JUNCTION PROFILE WITH SIGE CHANNEL

BACKGROUND

The present disclosure relates to a semiconductor structure and a method of fabricating the same. More particularly, the present disclosure relates to a p-channel field effect transistor (pFET) device including a silicon germanium (SiGe) channel in which the junction profile of the source region and the drain region is abrupt. The present disclosure also relates to a method of fabricating such a pFET device.

The development of Si/SiGe heterostructure metal oxide semiconductor field effect transistors (MOSFETs) has been encouraged by their potentially higher carrier mobility, low cost and ease of integrating into current MOSFET processing flows. Compressively strained SiGe grown epitaxially on Si substrates can be used to create a two-dimensional hole channel, which has a lower effective mass thereby contributing to an enhanced mobility. By selective band-gap engineering, pseudomorphic SiGe channel pMOSFETs can be produced which provide a superior alternative to the lower hole mobility of conventional Si pMOSFETs.

One problem with conventional SiGe channel pMOSFETs is that a p-type dopant such as boron used in forming the source region and the drain region diffuses much slower in SiGe than Si. As such, the junction of the source region and the drain region in the underlying Si area encroaches more and is deeper for a given amount of junction/gate overlap than in a conventional Si MOSFET thereby degrading short channel effects.

A potential solution to this problem is to grow an extremely thick SiGe channel atop a Si substrate. Such a solution is however not feasible since an increased number of mis-fit dislocation defects will form in the SiGe layer which, in turn, will degrade the performance of the pMOSFET device.

SUMMARY

A semiconductor structure including a p-channel field effect transistor (pFET) device located on a surface of a silicon germanium (SiGe) channel is provided in which the junction profile of the source region and the drain region is abrupt. The term "abrupt" is used throughout the present disclosure to denote a junction profile in which dopant concentration in the silicon substrate is equal to or less than the dopant concentration in the SiGe semiconductor channel at the surface. The abrupt source/drain junctions, in turn, provide improved control of short channel effects.

The abrupt source/drain junctions for pFET devices are provided in this disclosure by forming an N- or C-doped Si layer directly beneath a SiGe channel layer which is located above a Si substrate. A structure is thus provided in which the N- or C-doped Si layer (sandwiched between the SiGe channel layer and the Si substrate) has approximately the same diffusion rate for a p-type dopant as the overlying SiGe channel layer. Since the N- or C-doped Si layer and the overlying SiGe channel layer have substantially the same diffusivity for a p-type dopant and because the N- or C-doped Si layer retards diffusion of the p-type dopant into the underlying Si substrate, abrupt source/drain junctions can be formed. In prior art structures including a SiGe channel layer located on and in direct contact with a Si substrate, buried source/drain junctions which encroach more under the gate and deeper into the Si substrate are formed.

In addition to providing pFET devices having an abrupt source/drain junction profile, the N- or C-doped Si layer also helps to control the threshold voltage roll-off of the pFET device. Without the abrupt junction the device leakage in the pFET increases due to closer proximity of the source/drain junctions underlying the SiGe channel. The closer proximity of the junctions results in higher sub-threshold leakage that is weakly controlled by the gate electrode and therefore degrades the short channel control of the pFET device.

In one aspect of the present disclosure, a method of forming a semiconductor structure including a pFET device located on a surface of a SiGe channel is provided. The method includes providing a structure including a Si substrate, an N- or C-doped Si layer located on an upper surface of the Si substrate, and a SiGe channel layer located on an upper surface of the N- or C-doped Si layer. A p-FET gate stack including at least a gate dielectric layer and a gate conductor is formed on an upper surface of the SiGe channel layer. A source region and a drain region each having an abrupt junction are then formed into the structure at a footprint of the pFET gate stack by ion implantation of a p-type dopant.

In another aspect of the present disclosure, a method of forming a semiconductor structure including a pFET device located on a surface of a SiGe channel is provided which includes providing a structure including a SiGe channel layer located on a surface of Si substrate. A pFET gate stack is then formed on a portion of the SiGe channel layer. Next, a halo ion implantation process is performed in which N or C are co-implanted with a halo ion to form an N- or C-doped Si layer at an upper region of the Si substrate and at a footprint of the pFET gate stack. A source region and a drain region are then formed into a portion of the SiGe layer and a portion of the N- or C-doped Si layer and at a footprint of the pFET gate stack by ion implantation of a p-type dopant, wherein the source region and the drain region have an abrupt junction profile.

In yet another aspect of the present disclosure, a semiconductor structure is provided including a Si substrate, a N- or C-doped Si layer located on an upper surface of the Si substrate, a SiGe channel layer located on an upper surface of the N- or C-doped Si layer, a pFET gate stack located on an upper surface of the SiGe channel layer, and a source region and a drain region, each of which is located within a portion of the SiGe layer, a portion of the N- or C-doped Si layer and at a footprint of the pFET gate stack, and each of which includes an abrupt junction.

DETAILED DESCRIPTION

The present disclosure, which provides a pFET device including a silicon germanium (SiGe) channel in which the junction profile of the source region and the drain region is abrupt and a method of forming the same, will now be described in greater detail by referring to the following discussion and drawings that accompany the present application. It is noted that the drawings are provided for illustrative purposes only and are not drawn to scale.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
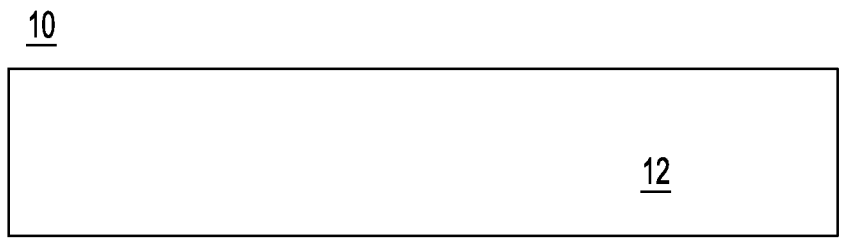
FIG. 1 is a pictorial representation (through a cross sectional view) illustrating an initial structure including a Si substrate that can be employed in one embodiment of the present disclosure.

Reference is now made to FIGS. 1-4 which depict one embodiment of the present disclosure. In the embodiment depicted in FIGS. 1-4, an N- or C-doped Si layer is formed after forming a SiGe channel layer on an upper surface of a Si substrate. Referring first to FIG. 1, there is illustrated an initial structure 10 that can be employed in the present disclosure. The initial structure 10 comprises a Si substrate 12. In one embodiment, the Si substrate 12 is a bulk substrate. In another embodiment, the Si substrate 12 is a silicon-on-insulator substrate.

The Si substrate 12 may be single crystalline, polycrystalline or amorphous. Typically, single crystalline Si substrates are employed in the present disclosure. In some instances, the Si substrate 12 has a single crystal surface orientation. In another instances, hybrid Si substrates are employed which have different surface regions of different crystallographic orientations. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

When an SOI substrate is employed, the SOI substrate includes a handle substrate, a buried insulating layer located on an upper surface of the handle substrate, and a Si layer located on an upper surface of the buried insulating layer. The handle substrate of the SOI substrate may be a semiconductor material, which may be the same or different than the Si layer located atop the buried insulating layer. The term "semiconductor" as used herein in connection with the semiconductor material of the handle substrate denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate. In one embodiment, the handle substrate and is comprised of Si.

The handle substrate and the Si layer may have the same or different crystal orientation. For example, the crystal orientation of the handle substrate and/or the Si layer may be {100}, {110}, or {111}. Other crystallographic orientations besides those specifically mentioned can also be used in the present disclosure. The handle substrate and/or the Si layer of the SOI substrate may be a single crystalline semiconductor material, a polycrystalline material, or an amorphous material. Typically, at least the Si layer of the SOI substrate is a single crystalline semiconductor material.

The buried insulating layer of the SOI substrate may be a crystalline or non-crystalline oxide or nitride. In one embodiment, the buried insulating layer is an oxide. The buried insulating layer may be continuous or it may be discontinuous. When a discontinuous buried insulating region is present, the insulating region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of the Si layer of the SOI substrate is typically from 100 Å to 1000 Å, with a thickness from 500 Å to 700 Å being more typical. In some embodiments, and when an ETSOI (extremely thin semiconductor-on-insulator) substrate is employed, the Si layer of the SOI has a thickness of less than 100 Å. If the thickness of the Si layer is not within one of the above mentioned ranges, a thinning step such as, for example, planarization or etching can be used to reduce the thickness of the Si layer to a value within one of the ranges mentioned above.

The buried insulating layer of the SOI substrate typically has a thickness from 10 Å to 2000 Å, with a thickness from 1000 Å to 1500 Å being more typical. The thickness of the handle substrate of the SOI substrate is inconsequential to the present disclosure.

The Si substrate 12 may be doped, undoped or contain doped and undoped regions therein. For clarity, the doped regions are not specifically shown in the drawings of the present application. Each doped region within the Si substrate 12 may have the same, or they may have different conductivities and/or doping concentrations. The doped regions that are present in the Si substrate 12 are typically referred to as well regions and they are formed utilizing a conventional ion implantation process or gas phase doping.

In the particular embodiment illustrated in the drawings, the Si substrate 12 includes only a pFET device region; the nFET device region would be located to the periphery of the pFET device region shown. As such, the Si substrate 12 can be doped in the pFET device region shown to include a p-well region (not shown).

Figure 2:
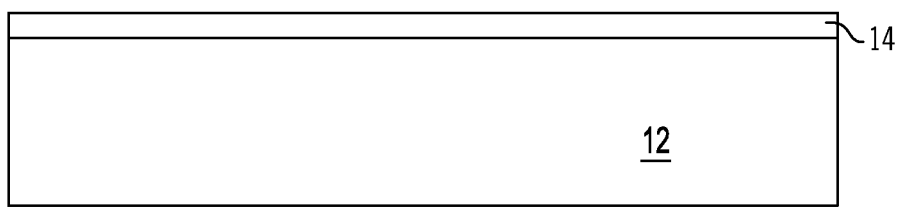
FIG. 2 is a pictorial representation (through a cross sectional view) depicting the initial structure of FIG. 1 after forming a SiGe channel layer on an upper surface of the Si substrate.

Referring now to FIG. 2, there is illustrated the initial structure of FIG. 1 after forming a SiGe channel layer 14 on an upper surface of the Si substrate 12. The SiGe channel layer 14 can be formed utilizing any conventional epitaxial growth process such as, for example, ultra high vacuum chemical vapor deposition UHV CVD. In some instances, the SiGe channel layer 14 can be formed utilizing any conventional precursor including a precursor containing both Si and Ge, or a combination of a Si-containing precursor and a Ge-containing precursor.

In the particular embodiment illustrated, the epitaxially formed SiGe channel layer 14 has the same crystal orientation as that of the Si substrate 12. Moreover, the SiGe layer 14 is typically a strained SiGe layer. In some embodiments, the SiGe channel layer 14 is a graded SiGe layer, while in other embodiments the SiGe channel layer 14 is a non-graded layer. The SiGe channel layer 14 can be represented by the formula $Si_{1-y}Ge_y$, wherein y may be in the range from 0.1 to about 0.4. The thickness of the SiGe channel layer 14 may vary depending on the conditions of the epitaxial growth process employed in forming the same. Typically, SiGe channel layer 14 has a thickness from 1 nm to 30 nm, with a thickness from 4 nm to 7 nm being more typical.

Figure 3:
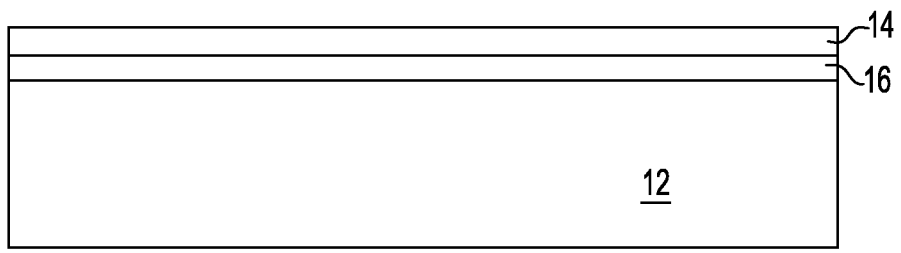
FIG. 3 is a pictorial representation (through a cross sectional view) depicting the structure of FIG. 2 after forming an N- or C-doped Si layer in the Si substrate such that the N- or C-doped layer is sandwiched between the SiGe channel layer and the Si substrate.

Referring now to FIG. 3, there is illustrated the structure of FIG. 2 after forming an N- or C-doped Si layer 16 in the Si substrate 12 such that the N- or C-doped Si layer 16 is sandwiched between the SiGe channel layer 14 and the Si substrate 12. In one embodiment, layer 16 is comprised of N-doped Si (i.e., Si:N). In yet another embodiment, layer 16 is comprised of C-doped Si (i.e., Si:C).

The N- or C-doped Si layer 16 can be formed by implanting N or C into an upper region of the Si substrate 12 which is abutting a lower surface of the SiGe channel layer 14. The implanting of N or C into the upper region of the Si substrate 12 can be performed utilizing a conventional ion implantation apparatus.

The conditions of the N or C ion implantation process may vary depending on the overall thickness of the SiGe channel layer 14 and the type of ion, i.e., N or C, being implanted into the upper region of Si substrate 12. By "upper region" of the Si substrate 12, it is meant that N or C ions are implanted at the upper surface of the Si substrate 12 to a depth of 20 nm below the upper surface of the Si substrate 12. Typically, the implanting of N or C ion into the upper region of Si substrate 12 can be performed at an energy from 2 keV to 10 keV, with an energy from 4 keV to 7 keV being more typical. The N or C ion implantation process is typically performed utilizing a dose of C or N from 1e12 atoms/cm$^2$ to 5e15 atoms/cm$^2$, with an ion dosage of 1e13 atoms/cm$^2$ to 5e14 atoms/cm$^2$ being more typical.

In one embodiment, the N or C ion implantation can be performed in a single step. Alternatively, and in another embodiment, the N or C ion implantation can be performed in multiple ion implantation steps using the same or different ion implantation conditions.

The thickness of the N- or C-doped Si layer 16 that is formed may vary depending on the conditions of the ion implantation process employed. Typically, the thickness of the N- or C-doped Si layer 16 that is formed is from 1 nm to 35 nm, with a thickness from 15 nm to 25 nm being more typical. The concentration of N or C within the doped Si layer is dependant on the dosage of N or C ions being implanted. Typically, the concentration of N or C within the doped Si layer is from 1 e17 atoms/cm$^3$ to 1e21 atoms/cm$^3$, with a concentration of N or C within the doped Si layer from 5e18 atoms/cm$^3$ to 1e20 atoms/cm$^3$ being more typical.

It is observed that in FIG. 3, a structure is provided in which the N- or C-doped Si layer 16 (sandwiched between the SiGe channel layer 14 and the Si substrate 12) has approximately the same diffusion rate for a p-type dopant as the overlying SiGe channel layer 14. Since the N- or C-doped Si layer 16 and the overlying SiGe channel layer 14 have substantially the same diffusivity for a p-type dopant and because the N- or C-doped Si layer 16 retards diffusion of the p-type dopant into the underlying Si substrate 12, abrupt source/drain junctions can be subsequently formed. In this embodiment, and as illustrated in FIG. 3, the N- or C-doped Si layer 16 is continuously present beneath the SiGe channel layer 14.

After forming the structure shown in FIG. 3, at least one isolation region (not shown) can be formed into the SiGe channel 14, the N- or C-doped Si layer 16, and a portion of Si substrate 12. The at least one isolation region can be a trench isolation region or a field oxide isolation region. The trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the isolation region provides isolation between neighboring gate regions, typically required when the neighboring gates have opposite conductivities, i.e., nFETs and pFETs. As such, the at least one isolation region separates an nFET device region from a pFET device region.

Figure 4:
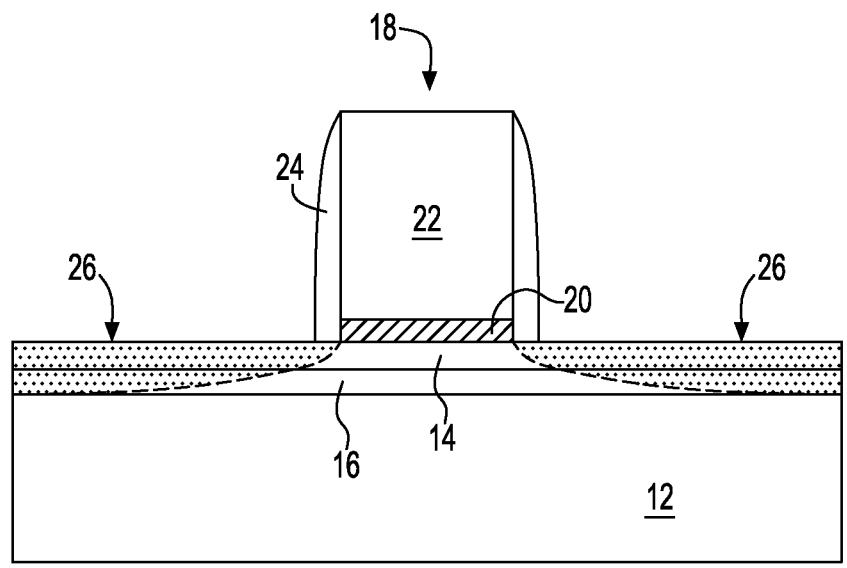
FIG. 4 is a pictorial representation (through a cross sectional view) depicting the structure of FIG. 3 after forming a pFET on a portion of the SiGe channel layer.

Reference is now made to FIG. 4 which depicts the structure of FIG. 3 after forming a pFET 18 in the pFET device region shown. The pFET 18 comprises a pFET gate stack including a gate dielectric layer 20 and a gate conductor 22. The pFET 18 shown in FIG. 4 also includes an optional sidewall spacer 24, source/drain extensions (not particularly shown) and a source region and a drain region collectively referred to herein as source/drain regions 26. The source/drain regions 26 have an abrupt junction associated therewith. The pFET 18 can be formed utilizing any conventional processing flow including the steps of deposition, lithography and etching. Alternatively, a replacement gate process can be employed in forming the pFET 18.

The gate dielectric layer 20 is comprised of any insulating material such as silicon oxide, silicon nitride or silicon oxynitride. In one embodiment, the gate dielectric layer 20 is a high k gate dielectric that has a dielectric constant of greater than silicon oxide, i.e., 4.0 or greater. All dielectric constants mentioned herein are relative to a vacuum unless otherwise noted. Specifically, the high k gate dielectric that can be employed includes, but is not limited to, an oxide, nitride, oxynitride and/or silicate including metal silicates and nitrided metal silicates. In one embodiment, the high k gate dielectric can be comprised of an oxide such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the high k gate dielectric. Each value of x is independently from 0.5 to 3 and each value of y is independently from 0 to 2. In some embodiments, $HfO_2$, hafnium silicate and hafnium silicon oxynitride are employed as the high k gate dielectric.

The physical thickness of the gate dielectric layer 20 may vary, but typically, the gate dielectric layer 20 has a thickness from 0.5 nm to 10 nm, with a thickness from 0.5 nm to about 3 nm being more typical. The gate dielectric layer 20 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The gate dielectric layer 20 may also be formed utilizing any combination of the above processes. The gate dielectric material within each of the various device regions can be the same or different. Different gate dielectric materials can be formed by utilizing block mask technology.

As mentioned above, the pFET 18 also includes a gate conductor (or gate electrode) 22. The gate conductor 22 that is employed may comprise any conductive material including, but not limited to, polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayers thereof. In one embodiment, the gate conductor 22 is comprised of p-type gate metal such as, for example, $RuO_2$. In some instances, a single layer of gate conductor 22 is formed. In another instances, a first layer of conductive material and a second layer of conductive material are formed. In one embodiment, gate conductor 22 may include a stack, from bottom to top, of a conductive metal layer and an upper conductive Si-containing material layer; the conductive metal layer has a higher conductivity than the conductive Si-containing material layer.

The gate conductor 22 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other liked deposition processes. When Si-containing materials are used as the gate conductor 22, the Si-containing materials can be doped within an appropriate impurity by utilizing either an in-situ doping deposition process or by utilizing deposition, followed by a step such as ion implantation in which the appropriate impurity is introduced into the Si-containing material. When a metal silicide is formed, a conventional silicidation process is employed.

The as deposited gate conductor 22 typically has a thickness from 5 nm to 200 nm, with a thickness from 20 nm to 100 nm being more typical. The gate conductor material in the different device regions can be the same or different. Different gate conductive materials can be formed using block mask technology.

In some embodiments, an optional hard mask material (not shown) can be located atop the gate conductor 22. The optional hard mask material includes an oxide, a nitride, an oxynitride or any combination thereof including multilayered stacks. When present, the optional hard mask material is formed utilizing a conventional deposition process well known to those skilled in the art including, for example, CVD and PECVD. Alternatively, the optional hard mask material can be formed by a thermal process such as, for example, oxidation and/or nitridation. The thickness of the optional hard mask material may vary depending on the exact hard mask material employed as well as the process that is used in forming the same. Typically, the hard mask material has a thickness from 5 nm to 200 nm, with a thickness from 10 nm to 50 nm being more typical. The hard mask material is typically employed when the conductive material is a Si-containing material such as polysilicon or SiGe.

The source/drain extension regions (not shown) are formed utilizing any known extension ion implantation process. After the extension ion implantation, an anneal can be used to activate the implanted extension ions. The optional sidewall spacer 24 can be formed utilizing any known process including deposition of a spacer material, followed by etching. Typical spacer materials include an oxide and/or a nitride. After formation of the spacer, source/drain regions 26 are formed into an exposed surface of layers 14 and 16 at the footprint of the pFET 18; pFET 18 serves as an ion implantation mask. The source/drain regions 26 are formed utilizing a source/drain ion implantation process followed by annealing. In the particular embodiment illustrated, a p-type dopant such as B is implanted into layers 14 and 16. As mentioned above, the source/drain regions 26 have an abrupt junction. Since the N- or C-doped Si layer and the overlying SiGe channel layer have substantially the same diffusivity for a p-type dopant and because the N- or C-doped Si layer retards diffusion of the p-type dopant into the underlying Si substrate, abrupt source/drain junctions are formed.

In some embodiments, metal semiconductor alloy contacts can now be formed utilizing any process that is capable of forming a metal semiconductor alloy atop a semiconductor material. In one embodiment, the metal semiconductor alloy contacts can be formed utilizing a silicide process. The silicide process can be self-aligned to the outer edge of the spacer. The silicide process includes forming a metal capable of forming a metal semiconductor alloy when reacted with a semiconductor material. The metal used in forming the metal semiconductor alloy contact can include, but is not limited to, tantalum, titanium, tungsten, ruthenium, cobalt, nickel, or any suitable combination of those materials. A diffusion barrier such as titanium nitride or tantalum nitride can be formed atop the metal. An anneal is performed that causes reaction between the metal and the underlying semiconductor material forming metal semiconductor alloy regions. Typically, the anneal is performed at a temperature of at least 250° C. or above. A single anneal step or multiple anneal steps can be used. Any non-reacted metal and the optional diffusion barrier are removed after the anneal has been performed. In some embodiments, a metal semiconductor alloy contact can be formed directly atop the patterned conductive material, when no optional patterned hard mask is present and the conductive material is composed of a Si-containing material.

Figure 5:
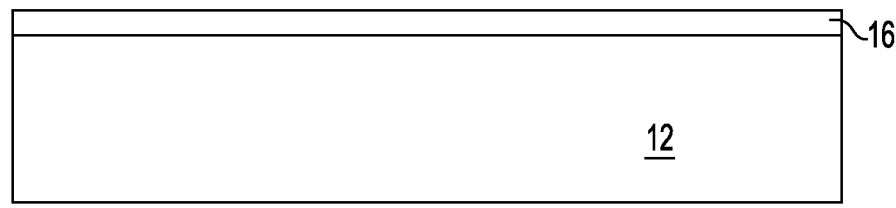
FIG. 5 is a pictorial representation (through a cross sectional view) depicting the initial structure of FIG. 1 after forming an N- or C-doped Si layer on, or within, an upper surface of the Si substrate in accordance with another embodiment of the present disclosure.
Figure 6:
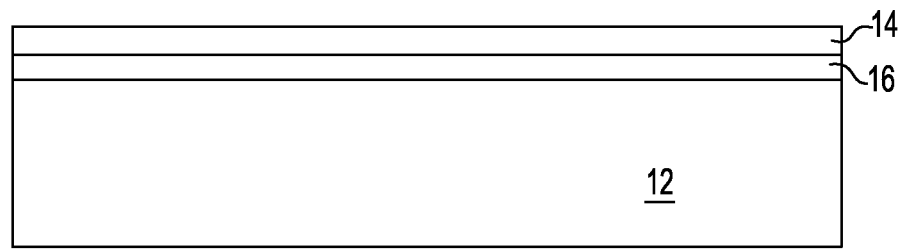
FIG. 6 is a pictorial representation (through a cross sectional view) depicting the structure of FIG. 5 after forming a SiGe channel layer on an upper surface of the N- or C-doped Si layer.

Referring now to FIGS. 5-6 which illustrate another embodiment of the present disclosure in which the N- or C-doped Si layer is formed prior to forming the SiGe channel layer. Reference is first made to FIG. 5 which illustrates the initial structure of FIG. 1 after forming an N- or C-doped Si layer 16 on, or within, an upper surface of Si substrate 12 in accordance with another embodiment of the present disclosure. In one embodiment of the present disclosure, the N- or C-doped Si layer 16 can be formed directly on an upper surface of Si substrate 12 by utilizing any conventional epitaxial growth process wherein a conventional Si precursor and a N dopant source or C dopant source are employed. Illustrative examples of an N dopant source include ammonia-based gas species. Illustrative examples of a C dopant source include methylsilane. When epitaxial growth is employed, the N- or C-doped Si layer 16 has the same crystal orientation as that of Si substrate 12.

Alternatively, the N- or C-doped Si layer 16 can be formed within an upper surface region of the Si substrate 12 utilizing an ion implantation process. The conditions of the implantation process may vary depending on the type of ion, i.e., N or C, being implanted into the upper region of Si substrate 12. Typically, the implanting of N or C into the upper region of Si substrate 12 can be performed at an energy from 2 keV to 10 keV, with an energy from 4 keV to 7 keV being more typical. The N or C ion implantation process is typically performed utilizing a dose of N or C from 1e12 atoms/$cm^2$ to 5e15 atoms/$cm^2$, with an ion dosage of 1e13 atoms/$cm^2$ to 5e14 atoms/$cm^2$ being more typical. The N or C ion implantation can be performed in a single step or multiple ion implantations using the same or different ion implantation conditions can be employed.

The thickness of the N- or C-doped Si layer 16 that is formed may vary depending on the technique that was employed in forming the same. Typically, the thickness of the N- or C-doped Si layer 16 that is formed is from 1 nm to 35 nm, with a thickness from 15 nm to 25 nm being more typical.

The concentration of N or C within the doped Si layer doped layer is dependant on the technique used in forming the N- or C-doped Si layer 16. For example, and when ion implantation is employed, the concentration of N or C within the doped Si layer is from 1e17 atoms/$cm^3$ to 1e21 atoms/$cm^3$, with a concentration of N or C within the doped Si layer from 5e18 atoms/$cm^3$ to 1e20 atoms/$cm^3$ being more typical. When an epitaxial growth process is used in forming the N- or C-doped Si layer 16, the concentration of N or C within the doped Si layer is from 0.01 atomic percent to 1 atomic percent, with a concentration of N or C within the doped Si layer from 0.1 atomic percent to 0.5 atomic percent being more typical.

Reference is now made to FIG. 6 which illustrates the structure of FIG. 5 after forming a SiGe channel layer 14 on the surface of the N- or C-doped Si layer 16. The SiGe channel layer 14 is formed as mentioned above in the embodiment shown in FIG. 2. In one embodiment, the SiGe channel layer 14 can be formed after epitaxial growth of layer 16 on the upper surface of Si substrate 12 without breaking vacuum. In another embodiment, the vacuum is broken between the epitiaxial growth of layers 14 and 16. The epitaxially formed SiGe channel 14 has the same crystal orientation as layer 16. In the illustrated embodiment, the N- or C-doped Si layer 16 is continuously present beneath the SiGe channel layer 14.

It is observed that in FIG. 6, a structure is provided in which the N- or C-doped Si layer 16 (sandwiched between the SiGe channel layer 14 and the Si substrate 12) has approximately the same diffusion rate for a p-type dopant as the overlying SiGe channel layer 14. Since the N- or C-doped Si layer 16 and the overlying SiGe channel layer 14 have substantially the same diffusivity for a p-type dopant and because the N- or C-doped Si layer 16 retards diffusion of the p-type dopant into the underlying Si substrate 12, abrupt source/drain junctions can be subsequently formed.

The structure shown in FIG. 6 can then be processed as described above to include the pFET 18 located within the active device region shown. Source/drain regions 26 having an abrupt junction profile can also be formed as described above.

Figure 7:
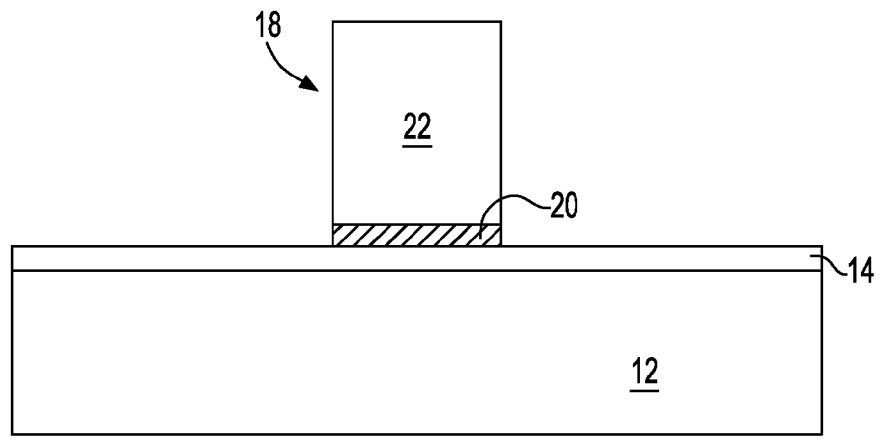
FIG. 7 is a pictorial representation (through a cross sectional view) depicting the structure of FIG. 2 after forming a pFET gate stack on a portion of the Si channel layer in accordance with another embodiment of the present disclosure.
Figure 8:
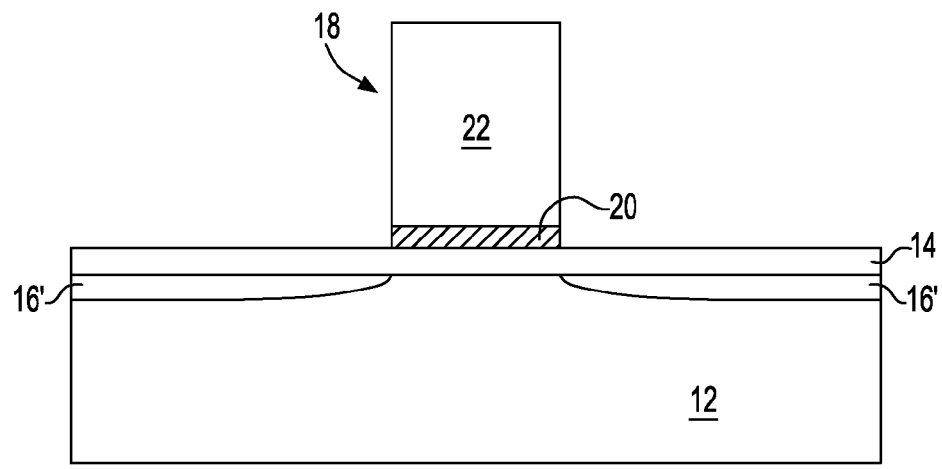
FIG. 8 is a pictorial representation (through a cross sectional view) depicting the structure of FIG. 7 after performing an implant step in which N or C is co-implanted with a halo ion into an upper region of the Si substrate.
Figure 9:
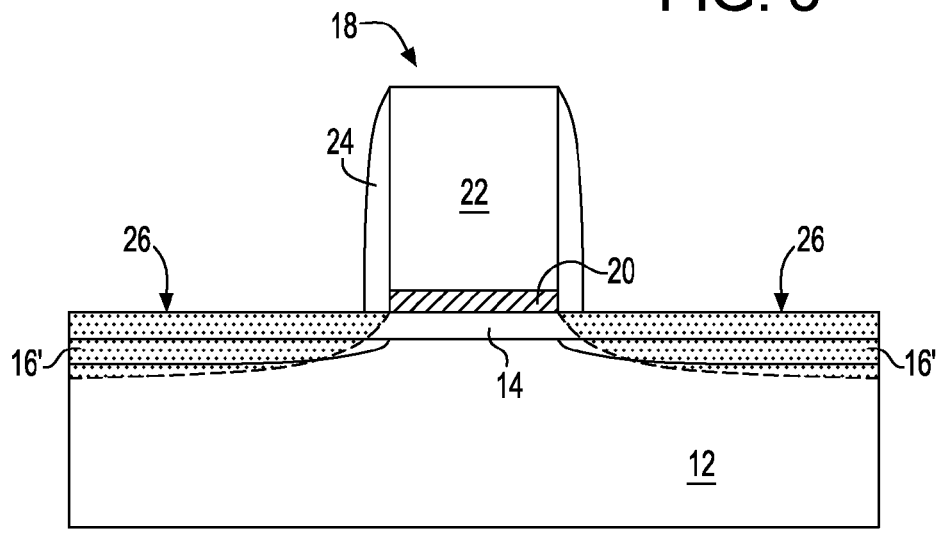
FIG. 9 is a pictorial representation (through a cross sectional view) depicting the structure of FIG. 8 after forming a source region and a drain region.

Reference is now made to FIGS. 7-9 which illustrate another embodiment of the present disclosure. In the embodiment illustrated in FIGS. 7-9, the gate stack of pFET 18 is formed prior to forming N- or C-doped Si layer 16' in the Si substrate 12. In this embodiment, the N- or C-doped Si layer 16' is formed by co-implanting N or C into the Si substrate 12 with the halo ion.

Referring first to FIG. 7, there is illustrated the structure of FIG. 2 after forming the gate stack of pFET 18 on the surface of the SiGe channel layer 14. The gate stack of pFET 18, i.e. (pFET gate stack) includes gate dielectric layer 20, and gate conductor 22. The gate stack of pFET 18 in this embodiment can be fabricated utilizing one of the techniques mentioned in forming the gate stack of pFET 18 shown in FIG. 4. Also, the materials, processes and thickness mentioned for gate dielectric layer 20, and gate conductor 22 for this embodiment are the same as those mentioned above in the embodiment illustrated in FIG. 4.

Referring now to FIG. 8, there is illustrated the structure of FIG. 7 after performing an implant step in which N or C is co-implanted with a halo ion into an upper region of the Si substrate. The implant step can be referred to herein as a halo ion implantation in which a halo ion and N or C are co-implanted into an upper regions of the Si substrate 12. In FIG. 8, reference numeral 16' denotes the N- or C-doped Si layer (or region) that is formed by implanting N or C into an upper surface of the Si substrate 12. For simplicity the halo implant region is not specifically shown in the drawings. The location of the halo implant region however is well known those skilled in the art. In this embodiment and as shown in the FIG. 8, the N- or C-doped layer 16 is partially present beneath the SiGe layer.

The co-implantation step used in this embodiment of the present disclosure to provide the structure illustrated in FIG. 8 includes the use of a halo ion implantation process in which a halo ion and N or C are co-implanted into the Si substrate 12. The halo ion includes a conductive impurity ion that is identical to the semiconductor substrate. The co-implantation of the halo ion and N or C is performed at an angle that is titled from a vertical direction of the surface of Si substrate 12. Typically, the co-implantation is performed at an angle from 15° to 45° from a vertical direction of the Si substrate 12, with an angle from 20° to 30° from a vertical direction of the Si substrate 12 being more typical.

The co-implantation step, i.e., the halo ion implantation, is typically performed at an energy from 5 keV to 30 keV, with an energy from 10 keV to 20 keV being more typical. The dosage of N or C that can be employed in this co-implantation step is typically from 1e12 atoms/$cm^2$ to 5e15 atoms/$cm^2$, with a dosage from 1e13 atoms/$cm^2$ to 5e14 atoms/$cm^2$ being more typical. The dosage of the halo ion being co-implanted is typically from 5e12 atoms/$cm^2$ to 1e14 atoms/$cm^2$, with a dosage from 1e13 atoms/$cm^2$ to 5e13 atoms/$cm^2$ being more typical.

It is observed that in FIG. 8, a structure is provided in which the N- or C-doped Si layer 16 (sandwiched between the SiGe channel layer 14 and the Si substrate 12) has approximately the same diffusion rate for a p-type dopant as the overlying SiGe channel layer 14. Since the N- or C-doped Si layer 16 and the overlying SiGe channel layer 14 have substantially the same diffusivity for a p-type dopant and because the N- or C-doped Si layer 16 retards diffusion of the p-type dopant into the underlying Si substrate 12, abrupt source/drain junctions can be subsequently formed.

FIG. 9 is a pictorial representation (through a cross sectional view) depicting the structure of FIG. 8 after forming optional sidewall spacer 24 and forming source/drain regions 26. The optional sidewall spacer 24 and the source/drain regions 26 can be formed utilizing the same basic processing steps and materials as mentioned above in regard to the embodiment depicted in FIG. 1-4. The source/drain regions 26 in this embodiment also have an abrupt junction profile. Since the N- or C-doped Si layer has approximately the same diffusion rate for a p-type dopant, such as B, as the overlying SiGe channel layer, and because the N- or C-doped Si layer retards diffusion of the p-type dopant into an underlying Si substrate, abrupt source/drain junctions are formed.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of fabricating a semiconductor structure comprising:
   providing a structure including a Si substrate, an N- or C-doped Si layer located on an upper surface of the Si substrate, and a SiGe channel layer located on an upper surface of the N- or C-doped Si layer;
   forming a p-FET gate stack directly on an upper surface of the SiGe channel layer; and
   forming a source region and a drain region into a portion of the SiGe channel layer, a portion of the N- or C-doped Si layer and at a footprint of the pFET gate stack by ion implantation of a p-type dopant, wherein said source region and said drain region have an abrupt junction profile and wherein a bottom surface portion of each of said source region and said drain region contacts the Si substrate.

2. The method of claim 1 wherein said providing the structure includes forming the SiGe channel layer on an upper surface of the Si substrate and then forming the N- or C-doped layer within an upper portion of the Si substrate by implanting N or C into said upper region of the Si substrate.

3. The method of claim 1 wherein said forming the SiGe channel layer on the upper surface of the Si substrate comprises an epitaxial growth process and said SiGe layer is strained.

4. The method of claim 2 wherein said implanting N or C is performed at an energy from 2 keV to 10 keV using an ion dose from 1e12 atoms/cm$^2$ to 5e15 atoms/cm$^2$.

5. The method of claim 1 wherein said providing the structure includes forming the N- or C-doped Si layer on an upper surface of the Si substrate, and then forming the SiGe channel layer on an upper surface of the N- or C-doped Si layer.

6. The method of claim 5 wherein said forming the N- or C-doped Si layer and forming the SiGe channel layer both include an epitaxial growth process.

7. The method of claim 6 wherein vacuum is maintained during forming the N- or C-doped Si layer and forming the SiGe channel layer.

8. The method of claim 1 wherein said providing the structure includes forming the N- or C-doped Si layer within an upper region of the Si substrate, and then forming the SiGe channel layer on an upper surface of the N- or C-doped Si layer.

9. The method of claim 8 wherein said forming the N- or C-doped Si layer includes ion implanting N or C into the upper region of the Si substrate.

10. The method of claim 9 wherein said implanting N or C is performed at an energy from 2 keV to 10 keV using an ion dose from 1e12 atoms/cm$^2$ to 5e15 atoms/cm$^2$.

11. The method of claim 8 wherein forming the SiGe channel layer comprises an epitaxial growth process.

12. A semiconductor structure comprising:
    a Si substrate, a N- or C-doped Si layer located on an upper surface of the Si substrate, a SiGe channel layer located on an upper surface of the N- or C-doped Si layer, a pFET gate stack located directly on an upper surface of the SiGe channel layer, and a source region and a drain region, each of which is located within a portion of the SiGe layer, a portion of the N- or C-doped Si layer and at a footprint of the pFET gate stack, and each of which includes an abrupt junction and wherein a bottom surface portion of each of said source region and said drain region contacts the Si substrate.

13. The semiconductor structure of claim 12 wherein said N- or C-doped Si layer is an epitaxial N- or C-doped Si layer.

14. The semiconductor structure of claim 12 wherein said SiGe channel layer is an epitaxial SiGe channel layer.

15. The semiconductor structure of claim 12 wherein said SiGe channel layer is strained.

16. The semiconductor structure of claim 12 wherein said N- or C-doped Si layer comprises Si:N.

17. The semiconductor structure of claim 12 wherein said N- or C-doped Si layer comprises Si:C.

18. The semiconductor structure of claim 12 wherein said N- or C-doped Si layer is continuously present beneath the SiGe channel layer.

19. The semiconductor structure of claim 12 wherein said N- or C-doped layer is partially present beneath the SiGe layer.

* * * * *